(12) United States Patent
Wu et al.

(10) Patent No.: US 8,190,976 B1
(45) Date of Patent: May 29, 2012

(54) HIGH-SPEED INTERFACE FOR HOLOGRAPHIC STORAGE READ CHANNEL

(75) Inventors: Zining Wu, Los Altos, CA (US); Seo-How Low, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1179 days.

(21) Appl. No.: 11/828,975

(22) Filed: Jul. 26, 2007

Related U.S. Application Data

(60) Provisional application No. 60/821,659, filed on Aug. 7, 2006.

(51) Int. Cl.
*H03M 13/00* (2006.01)

(52) U.S. Cl. ........ 714/780; 714/755; 714/786; 714/784; 714/794; 714/795; 375/262; 375/341

(58) Field of Classification Search ................ 714/784, 714/755, 786, 780, 794–795; 375/262, 341
See application file for complete search history.

(56) References Cited

U.S. PATENT DOCUMENTS

| | | | |
|---|---|---|---|
| 4,566,031 A * | 1/1986 | Kirk | 348/40 |
| 7,549,111 B2 * | 6/2009 | Haustein et al. | 714/786 |
| 2003/0074626 A1 * | 4/2003 | Coker et al. | 714/752 |
| 2004/0131368 A1 * | 7/2004 | Sawada et al. | 398/202 |
| 2005/0169395 A1 * | 8/2005 | Monta | 375/261 |
| 2006/0193634 A1 * | 8/2006 | Wang et al. | 398/118 |
| 2007/0294458 A1 * | 12/2007 | Danilak | 710/313 |
| 2008/0163026 A1 * | 7/2008 | Varnica et al. | 714/755 |

* cited by examiner

*Primary Examiner* — Guy Lamarre

(57) ABSTRACT

Embodiments of the present invention provide a read channel including a front end to receive an optical image, convert the optical image into multi-bit soft information, and to serially transmit the multi-bit soft information to other components of the read channel. Other embodiments may be described and claimed.

30 Claims, 2 Drawing Sheets

HIGH-SPEED INTERFACE FOR HOLOGRAPHIC STORAGE READ CHANNEL

CROSS-REFERENCE TO RELATED APPLICATIONS

The present application claims priority to U.S. Patent Application No. 60/821,659, filed Aug. 7, 2006, entitled "High Speed Interface for Holographic Storage Decoder," the disclosure of which is hereby incorporated by reference in its entirety.

TECHNICAL FIELD

Embodiments of the present invention relate to the field of integrated circuits, and more particularly, to read channels for holographic storage systems.

BACKGROUND

Advances in optics and storage media have led to the creation of cost-efficient holographic storage systems. In a holographic storage system, data pages may be stored in a holographic medium by using an interference pattern between a signal beam and a reference beam to change the refractive index of areas of the medium. A data page may be written into the medium as a bit array through the use of a spatial light modulator (SLM). Changing the properties of the reference beam, e.g., incident angles, wavelength, etc., may allow the same three-dimensional space to be used for many pages.

The read operations of these holographic storage systems involve providing the same reference beam into the holographic medium without the signal beam, which may result in a reproduced signal beam displaying the stored bit array. This reproduced signal beam may be converted to electrical signals, equalized, and decoded through a read channel.

While these holographic storage systems are capable of high storage densities with a long archival life, limitations in present read channels may prevent applications from taking full advantage of these storage systems.

SUMMARY OF THE INVENTION

Various embodiments of this invention include a read channel, e.g., a holographic read channel, having a front end to receive an optical image representing encoded data and to convert the optical image into multi-bit soft information representing the encoded data. The multi-bit soft information may be in the form of log-likelihood ratio (LLR) values. The front end may then transmit the soft information, via a serial communication link, to a decoder of the read channel for decoding. In some embodiments, the soft information may be differentially transmitted via the serial communication link.

In an embodiment, the serial communication link communicatively coupling the front end to the decoder may include one or more serial Advanced Technology Attachment (ATA) communication channels.

The decoder of the holographic read channel may include an inner decoder and an outer decoder to decode various levels of coding in accordance with some embodiments. The inner decoder may be a low density parity check (LDPC) decoder adapted to decode LDPC codes in the encoded data; while the outer decoder may be a Reed-Solomon decoder adapted to decode Reed-Solomon codes in the encoded data.

In some embodiments, each of the front end, the inner decoder, and the outer decoder may be implemented in respective integrated circuits. Partially decoded data from a first integrated circuit including the inner decoder may be transmitted, e.g., via a serial communication link, to a second integrated circuit including the outer decoder for subsequent decoding operations. In other embodiments, the inner decoder and the outer decoder may be implemented in the same integrated circuit.

In various embodiments, the front end of the read channel may include an optical front end and a digital front end operatively coupled to one another. The optical front end may have a photosensitive detector, e.g., charge-coupled device (CCD) or a complementary metal-oxide semiconductor (CMOS) device, to receive the optical image representing encoded data and convert the optical image into an electrical image. The digital front end may receive the electrical image and convert it into a plurality of LLR values for transmission to the decoder.

In some embodiments, the read channel may be integrated within a holographic storage system include a holographic storage medium and a light source to illuminate the storage medium with a reference beam to generate the optical image representing the encoded data.

In yet another embodiment, a read channel may include a conversion means for converting an optical image representing encoded data into multi-bit soft information representing the encoded data, e.g., a plurality of log-likelihood ratio (LLR) values; a decoding means for decoding the encoded data from the plurality of LLR values; and a serial communication means for serially transmitting the plurality of LLR values from the conversion means to the decoding means.

In various embodiments, the encoded data may include a first and a second level of coding. In at least some of these embodiments, the decoding means may include a first decoding means for decoding the first level of coding to provide partially decoded data; a second decoding means for decoding the second level of coding; and another serial communication means for serially transmitting the partially decoded data from the first decoding means to the second decoding means.

In various embodiments, the conversion means may include an optical conversion means for converting the optical image into an electrical image and a digital conversion means for converting the electrical image into the plurality of LLR values.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of this description, the phrase "A/B" means (A) or (B); the phrase "A and/or B" means (A), (B), or (A and B); the phrase "A, B, and/or C" means (A), (B), (C), (A and B), (A and C), (B and C), or (A, B, and C); and the phrase "(A)B" means (B) or (A and B), that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

As used herein, reference to a "component" may refer to a hardware, a software, and/or a firmware component employed to obtain a desired outcome. Although only a given number of discrete components may be illustrated and/or described, such components may nonetheless be represented by additional components or fewer components without departing from the spirit and scope of embodiments of the invention.

Embodiments of the present invention provide a holographic read channel including a front end serially coupled to a decoder.

Figure 1:
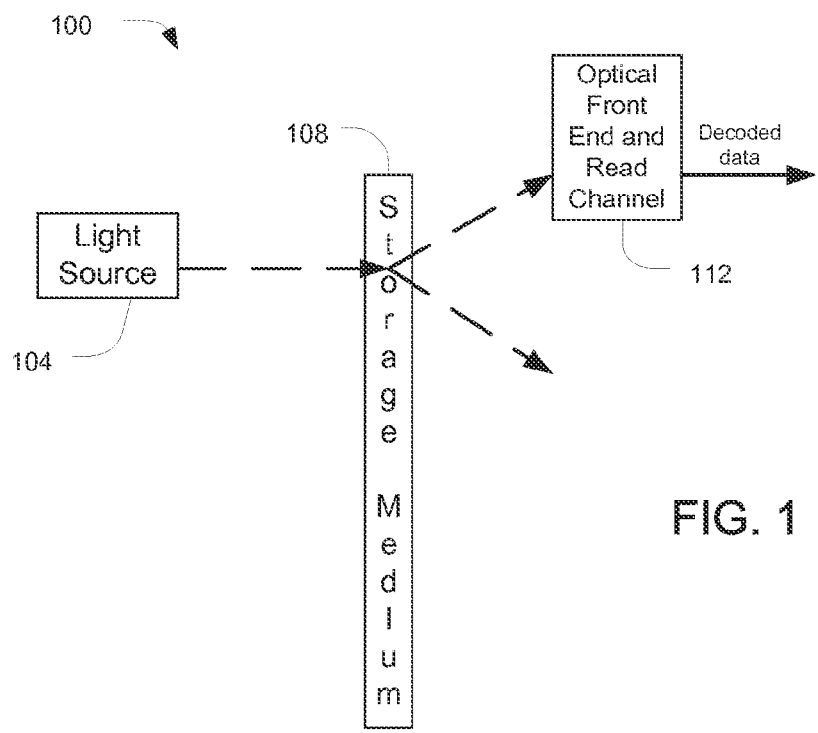
FIG. 1 schematically illustrates a holographic storage system in accordance with various embodiments of this invention.

FIG. 1 schematically illustrates a holographic storage system 100 in accordance with various embodiments of this invention. The system 100 may include a light source 104 to provide a reference light beam for retrieving data stored in a storage medium 108, which may include, e.g., an inorganic photorefractive crystal or an organic photopolymer. During a read operation, a reference beam, which may be a coherent laser light beam, may be directed into the storage medium 108 and split into a signal beam, corresponding to the signal beam used to create the stored data, and a discarded beam. The re-created signal beam may appear as an optical image representing a data page as an array of bits.

During a read operation, an optical front end and read channel 112 may receive the optical image representing the stored data, possibly corrupted by noise, and perform signal processing operations to recover the stored data. A read operation including, e.g., optical-to-electrical conversion, equalization, and error-recovery, may be performed by a number of components of the read channel 112 as will be discussed in further detail below.

Figure 2:
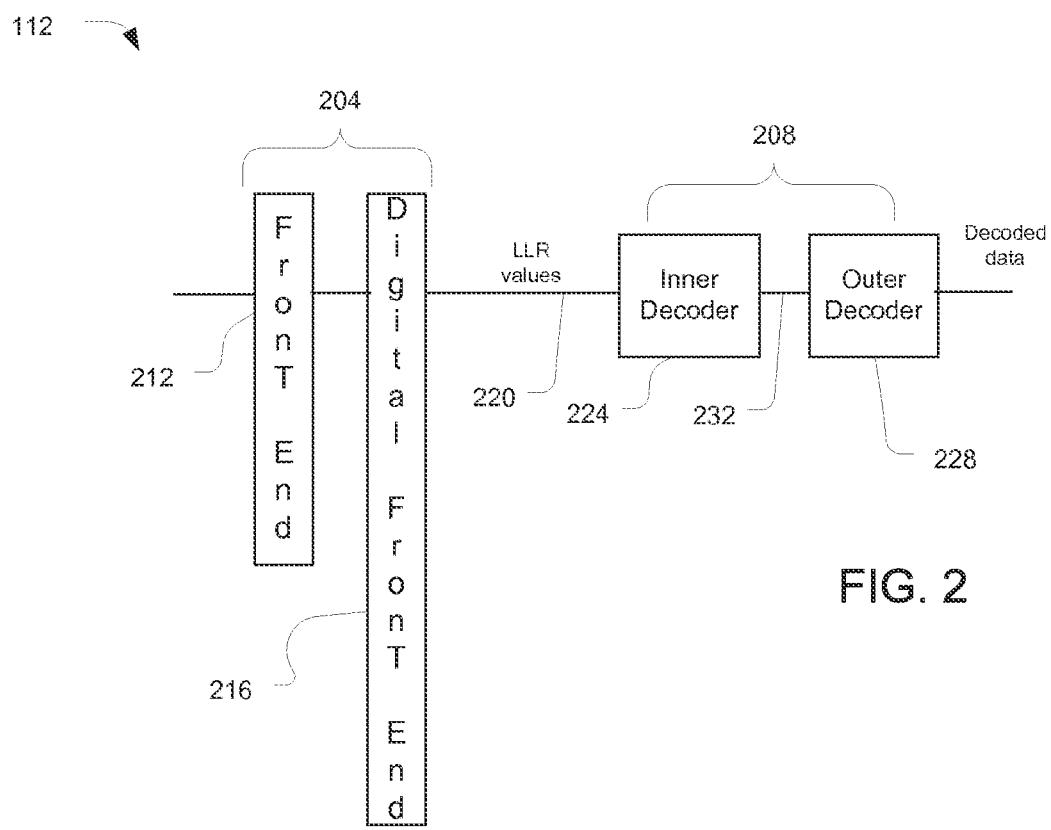
FIG. 2 schematically illustrates a read channel in accordance with various embodiments of this invention.

FIG. 2 schematically illustrates the read channel 112 in accordance with various embodiments of this invention. The read channel 112 may include components such as a front end 204 and a decoder 208, operatively coupled to one another as shown. The front end 204 may be the component of the read channel that communicatively interfaces with the storage medium 108 to provide preliminary signal conversion operations that convert optical signals representing data into an appropriate form for processing by the decoder 208. The front end 204 may include an optical front end 212 to provide image sensor operations and a digital front end 216 to provide image processing operations. The optical front end 212 and the digital front end 216 may be implemented together in a common integrated circuit (IC) or in respective ICs, which may be coupled to the same printed circuit board (PCB).

Figure 3:
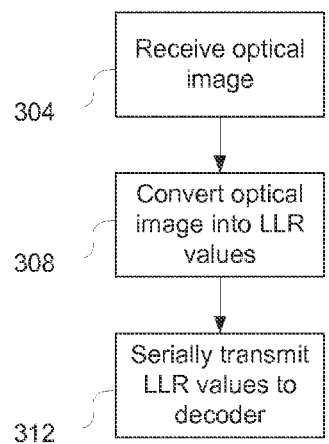
FIG. 3 is a flowchart illustrating a front end operation of a read channel in accordance with various embodiments of this invention.

Referring also to FIG. 3, which describes conversion operation of the front end 204 in accordance with various embodiments of this invention, the optical front end 212 may receive an optical image, e.g., the bit array image representing the data page, with a photosensitive detector, block 304. The photosensitive detector may include an array of detector elements to convert light into electrical signals with values proportional to the amount of received light. Thus, the bit array image may illuminate the photosensitive detector, resulting in an array of pseudo-analog values. These values may appear in parallel since the bit array image may illuminate the entire face of the photosensitive detector at once. This array of pseudo-analog values may be referred to as an electrical image.

In various embodiments, the photosensitive detector of the optical front end 212 may be a charge-coupled device (CCD) or a complementary metal-oxide semiconductor device (CMOS). Furthermore, while the above exemplary embodiment discusses the optical front end 212 having one photosensitive detector, other embodiments may have other numbers of photosensitive detectors.

An electrical image generated at the photosensitive detector may be transmitted to the digital front end 216. The digital front end 216 may convert the optical image into multi-bit soft information representing the encoded data, block 308. The multi-bit soft information may be in the form of log-likelihood ratio (LLR) values. Other forms of multi-bit soft information include unprocessed analog-to-digital converter (ADC) samples, processed (e.g., by an equalizer) ADC samples, squared difference between sampled value and nominal recorded values, etc. While LLR values may be used extensively in this description, other embodiments may additionally/alternatively use any other type of multi-bit soft information.

An LLR value may be a value that conveys information about the value of a transmitted bit as well as a confidence level in the accuracy of the bit value. For example, a six-bit LLR value may be an integer in a range of {-32, 31}. The negative numbers may correspond to an indication that the transmitted bit was a zero, while the positive numbers may correspond to an indication that the transmitted bit was a one. The higher the absolute value of the LLR, the higher the confidence level. For example, a value of −32 may signify that the transmitted bit was a zero with a very high confidence.

The digital front end 216 may also serialize the LLR values for serial transmission to the decoder 208, block 312. In one embodiment, the serialization may be performed by transmitting the corresponding LLR values from left to right and then from top to bottom of the electrical image. In another embodiment, the serialization could be performed in an interleaved fashion, or by various other schemes. Each LLR value may be transmitted most significant bit (MSB) first or least significant bit (LSB) first, depending on the objectives of the specific application. The serial transmission may include the transmission using differential signals over a serial communication link 220. For example, it could use one or more serial Advanced Technology Attachment (ATA) communication channels.

The decoder 208 may receive the LLR values via the serial communication link 220 and perform levels of decoding to recover the stored data. The levels of decoding may correspond to cascaded error-correction codes (hereinafter referred to as "inner codes" and "outer codes") used to store the data. In an embodiment, the levels of decoding may be distributed among an inner decoder 224, to decode the inner codes, and the outer decoder 228, to decode the outer codes, as shown.

The inner decoder 224 may operate to generate hard decisions from the LLR values, i.e., apply advanced decoding techniques to convert the multilevel LLR values into bit values. In an embodiment, the inner code used in storage of the data may be, e.g., low-density parity check (LDPC) codes. The inner decoder 224 may perform a first level of decoding to decode these LDPC codes through the use of an iterative decoding algorithm. During iterative decoding, the inner decoder 224 may use results from a decoding operation to improve the results of subsequent decoding operations. In this manner, the first level of decoding may be performed through a predetermined number of iterations, with an increased number generally corresponding to better hard-decision error rates.

The inner decoder 224 may transfer the hard decisions to the outer decoder 228 through another communication link 232. The hard decisions may represent partially decoded data, which is data that has had the inner codes removed, but still includes the outer codes. The outer decoder 228 may receive the hard decisions and perform a second level decoding to decode the outer codes, e.g., Reed-Solomon codes. The outer decoder 228 may output the decoded data for use in the particular application in which the holographic storage system 100 is employed.

In various embodiments, the inner decoder 224 may also provide de-interleaving between the decoding of the inner and outer codes.

In various embodiments, the front end 204, the inner decoder 224, and the outer decoder 228 may be implemented in respective ICs to provide sufficient processing capabilities for respective operations. These ICs may be coupled to the same PCB as the components of the front end 204. In other embodiments, the components of the read channel 112 may be arranged in other numbers of ICs, e.g., the optical front end 212 and the digital front end 216 may be implemented in respective ICs, the inner decoder 224 and the outer decoder 228 may be implemented in the same IC, etc.

While the holographic storage system 100 may be employed in a wide variety of applications, it may be particularly useful in applications having large storage requirements with high read-rate targets. In one embodiment, the holographic storage system 100 may be employed in a video streaming application. In another embodiment, it may be utilized to store large databases in medical applications or document archival systems and, at the same time, provide very fast random access times.

In an embodiment, the transfer rate at the output of the inner decoder 224 ($TR_O$) may be related to the transfer rate at the input of the inner decoder 224 ($TR_I$) by the following equation:

$$TR_O * LS/DR = TR_I;\qquad \text{EQ. 1}$$

where LS is the size of LLR values input to the inner decoder 224 and CR is the decode rate of the inner decoder 224.

In an example, a video streaming application may have a target output transfer rate $TR_O$ of approximately 22 megabytes per second (MB/s); the inner decoder 224 may operate at a decode rate of 0.5; and input LLR values may be 6-bit values. Therefore, for this embodiment, the input transfer rate $TR_I$ may be $(22 \times 2^{20 \times 8}) * 6/0.5 = 2.2146$ gigabits per second (Gb/s).

Achieving this target transfer rate at the input of the inner decoder 224 by sending signals from the front end 204 to the decoder 208 via a parallel bus located in the PCB may be difficult. Parallel buses, in addition to not being area efficient, may also limit transfer speeds due to interference between adjacent traces on the PCB and the requirement to achieve sufficient drive strength to drive signals that are compatible with low-voltage transistor-transistor logic (LVTTL) or low-voltage CMOS (LVCMOS). These challenges associated with parallel buses tend to limit the transfer speeds to approximately 250 megahertz (MHz).

On the other hand, by using a properly designed serial link implementation, the communication link 220, as shown above, may support a 3 Gb/s signaling rate, thereby allowing for the target rate of 22 Mb/s to be reached at the output of the inner decoder 224, and at the same time avoiding any issues associated with wide parallel buses on the PCB. The communication link 220 may also be modified to accommodate embodiments having higher target rates. For example, an 88 MB/s target at the output of the inner decoder 224 may correspond to an approximately 8.86 Gb/s target at the input of the inner decoder 224. The serial communication link 220 may accommodate this rate by employing a relatively short differential serial channel on the PCB, which may make it possible to reach speeds of 10 Gb/s. As another example, a 176 MB/s target at the output of the inner decoder 224 may correspond to an approximately 17.72 Gb/s target at the input of the inner decoder 224. For such an embodiment, the serial communication link 220 may accommodate this rate by employing a plurality of differential serial channels on the PCB.

Figure 4:
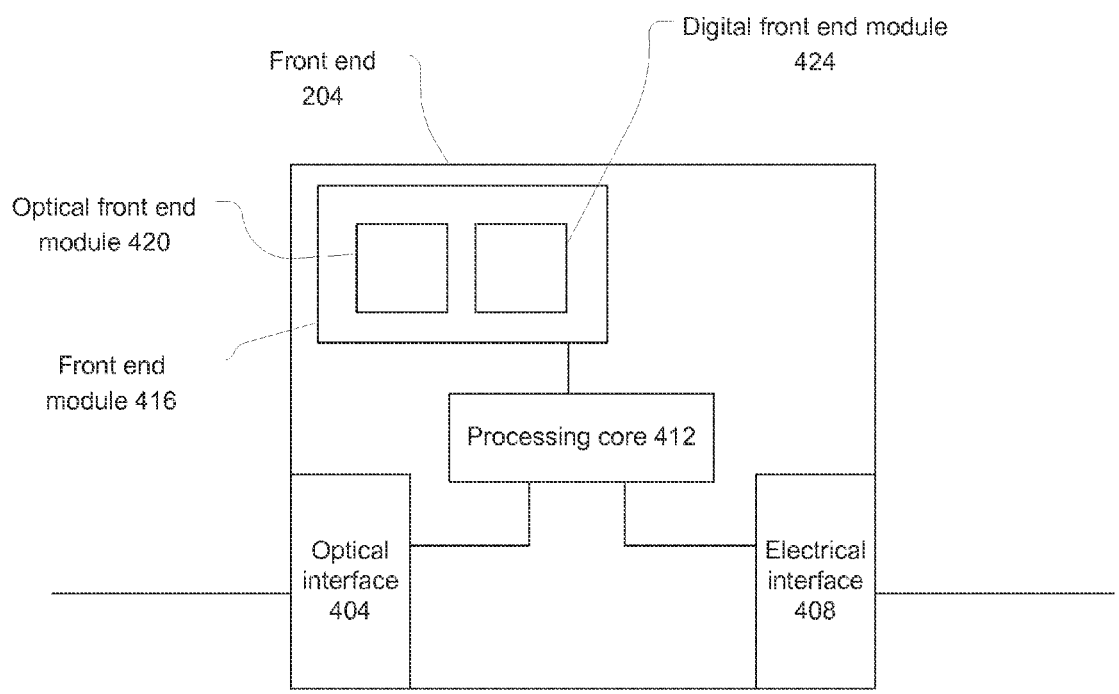
FIG. 4 schematically illustrates a front end in accordance with various embodiments of this invention.

FIG. 4 schematically illustrates the front end 204 in accordance with various embodiments of this invention. In this embodiment, the front end 204 may include an optical interface 404, e.g., a photosensitive detector, and an electrical interface 408, e.g., a serial ATA interface.

The front end 204 may also include a processing core 412 operatively coupled to the optical interface 404 and the electrical interface 408. The processing core 412 may also be operatively coupled to a front end module 416. The module 416 may include an optical front end module 420 and a digital front end module 424. Thus, the optical front end module 420 may include processing instructions that, when accessed by the processing core 412, may allow for the processing core 412 to perform the optical front end operations to convert an optical image received at the optical interface 404 to an electrical image as described above in connection with the various embodiments of this invention. Likewise, the digital front end module 424 may include processing instructions that, when accessed by the processing core 412, may allow for the processing core 412 to perform the digital front end operations to convert the electrical image into LLR values to be serially transmitted from the electrical interface 408 described above in connection with various embodiments of this invention.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A holographic storage read channel for a holographic storage system, the holographic storage read channel comprising:
   a serial communication link;
   a front end configured to (i) receive an optical image representing encoded data, (ii) convert the optical image into multi-bit soft information representing the encoded data, and (iii) serially transmit the multi-bit soft information via the serial communication link; and
   a decoder comprising an inner decoder and an outer decoder,
   wherein the inner decoder is configured to (i) serially receive the multi-bit soft information from the front end via the serial communication link, (ii) decode the multi-bit soft information to generate hard decisions, and (iii) transmit the hard decisions from the inner decoder to the outer decoder via a parallel communication link, and
   wherein the outer decoder is configured to, based on the hard decisions received from the inner decoder, decode the encoded data.

2. The holographic storage read channel of claim 1, wherein the multi-bit soft information includes a plurality of log-likelihood ratio (LLR) values.

3. The holographic storage read channel of claim 1, wherein the inner decoder comprises:
   a low density parity check (LDPC) decoder configured to decode LDPC codes in the encoded data.

4. The holographic storage read channel of claim 1, wherein the outer decoder comprises:
   a Reed-Solomon decoder configured to decode Reed-Solomon codes in the encoded data.

5. The holographic storage read channel of claim 1, wherein the front end, the inner decoder, and the outer decoder are each implemented in respective integrated circuits.

6. The holographic storage read channel of claim 1, wherein the inner decoder and the outer decoder are implemented in an integrated circuit.

7. The holographic storage read channel of claim 1, wherein the front end comprises:
   an optical front end having a photosensitive detector configured to receive the optical image representing encoded data and convert the optical image into an electrical image.

8. The holographic storage read channel of claim 7, wherein the photosensitive detector comprises a charge-coupled device (CCD) or a complementary metal-oxide semiconductor (CMOS) device.

9. The holographic storage read channel of claim 7, wherein the front end further comprises:
   a digital front end configured (i) to receive the electrical image, (ii) to convert the electrical image into the plurality of LLR values, and (iii) to serially transmit the multi-bit soft information via the serial communication link.

10. The holographic storage read channel of claim 1, wherein the serial communication link comprises a plurality of differential serial channels.

11. A method comprising:
    receiving, at a front end of a holographic read channel of a holographic storage system, an optical image representing encoded data;
    converting, at the front end, the optical image into multi-bit soft information representing the encoded data; and
    transmitting, serially from the front end to a decoder within the holographic storage system, the multi-bit soft information,
    wherein the encoded data has (i) a first level and (ii) a second level of coding, wherein the decoder comprises an inner decoder and an outer decoder, and wherein the method further comprises
       receiving serially, by the inner decoder, the multi-bit soft information,
       decoding, by the inner decoder, the first level of coding to provide partially decoded data, and
       transmitting parallely the partially decoded data from the inner decoder to the outer decoder.

12. The method of claim 11, wherein the transmitting, serially from the front end to a decoder within the holographic storage system, the multi-bit soft information further comprises differentially transmitting the multi-bit soft information.

13. The method of claim 11, further comprising:
    based on the partially decoded data, decoding, by the outer decider, the second level of coding to provide decoded data.

14. The method of claim 11, further comprising transmitting, serially, the partially decoded data from a first integrated circuit including the inner decoder to a second integrated circuit including the outer decoder.

15. The method of claim 14, wherein the transmitting, serially, the partially decoded data from the first integrated circuit to the second integrated circuit further comprises transmitting the partially decoded data via a serial communication link.

16. The method of claim 11, wherein the decoding of the first level of coding comprises decoding low-density parity check (LDPC) codes.

17. The method of claim 11, wherein the decoding of the second level of coding comprises decoding Reed-Solomon codes.

18. The method of claim 11, wherein the converting of the optical image into the multi-bit soft information comprises:
    converting the optical image into an electrical image; and
    converting the electrical image into the multi-bit soft information.

19. A system comprising:
    a holographic storage medium;
    a light source configured to illuminate the holographic storage medium with a reference beam to generate an optical image representing encoded data; and
    a read channel including
       a serial communication link, wherein the serial communication link comprises a plurality of differential serial channels;
       a front end configured to (i) receive the optical image, (ii) convert the optical image into multi-bit soft information representing the encoded data, and (iii) transmit, serially, the multi-bit soft information via the serial communication link; and
       a decoder configured to (i) receive, serially, the multi-bit soft information from the front end via the serial communication link, and (ii) decode the encoded data from the multi-bit soft information.

20. The system of claim 19, wherein the multi-bit soft information includes a plurality of log-likelihood ratio (LLR) values.

21. The system of claim 19, wherein the decoder comprises (i) an inner decoder and (ii) an outer decoder.

22. The system of claim 21, wherein the inner decoder is configured to decode low-density parity check (LDPC) codes in the encoded data.

23. The system of claim 21, wherein the outer decoder is configured to decode Reed-Solomon codes in the encoded data.

24. The system of claim 21, wherein the front end, the inner decoder, and the outer decoder are each implemented in respective integrated circuits.

25. The system of claim 19, wherein the front end comprises:
- an optical front end having a photosensitive detector configured (i) to receive the optical image representing encoded data and (ii) to convert the optical image into an electrical image; and
- a digital front end configured (i) to receive the electrical image, (ii) to convert the electrical image into the multi-bit soft information, and (iii) to transmit, serially, the multi-bit soft information via the serial communication link.

26. A machine-accessible medium having associated instructions, which, when accessed, results in a holographic read channel of a holographic storage system:
- receiving, via an optical interface of the holographic read channel, an optical image representing encoded data;
- converting the optical image into multi-bit soft information representing the encoded data;
- transmitting, serially via a serial interface of the holographic read channel, the multi-bit soft information to an inner decoder;
- based on the multi-bit soft information, generating hard decisions in the inner decoder; and
- transmitting, in parallel, the hard decisions from the inner decoder to an outer decoder.

27. The machine-accessible medium of claim 26, wherein the associated instructions, when accessed, further results in the holographic read channel:
- differentially transmitting the multi-bit soft information.

28. An apparatus for a holographic read channel of a holographic storage system, the apparatus comprising:
- means for converting an optical image representing encoded data into multi-bit soft information representing the encoded data;
- means for decoding the encoded data from the multi-bit soft information, wherein the means for decoding comprises (i) means for inner decoding and (ii) means for outer decoding;
- means for serially transmitting the multi-bit soft information from the means for converting to the means for inner decoding; and
- means for parallely transmitting the hard decisions from the means for inner decoding to the means for outer decoding.

29. The apparatus of claim 28, wherein the encoded data has a first and a second level of coding and the means for decoding comprises:
- a first means for decoding the first level of coding to provide partially decoded data;
- a second means for decoding the second level of coding; and
- another means for serially transmitting the partially decoded data from the first decoding means to the second decoding means.

30. The apparatus of claim 28, wherein the conversion means comprises:
- means for converting the optical image into an electrical image; and
- means for converting the electrical image into the multi-bit soft information.

* * * * *